(12) United States Patent
Wang

(10) Patent No.: US 9,331,105 B2
(45) Date of Patent: May 3, 2016

(54) ARRAY SUBSTRATE, MANUFACTURING METHOD THEREOF AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventor: Xiao Wang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/548,911

(22) Filed: Nov. 20, 2014

(65) Prior Publication Data

US 2015/0372024 A1 Dec. 24, 2015

(30) Foreign Application Priority Data

Jun. 19, 2014 (CN) .......................... 2014 1 0276903

(51) Int. Cl.
*H01L 27/12* (2006.01)
*H01L 29/786* (2006.01)
*H01L 21/02* (2006.01)
*H01L 29/66* (2006.01)
*H01L 21/283* (2006.01)
*H01L 21/3205* (2006.01)
*H01L 21/3213* (2006.01)

(52) U.S. Cl.
CPC ........ *H01L 27/1248* (2013.01); *H01L 21/0217* (2013.01); *H01L 21/02164* (2013.01); *H01L 21/283* (2013.01); *H01L 21/3205* (2013.01); *H01L 21/32133* (2013.01); *H01L 27/127* (2013.01); *H01L 29/66742* (2013.01); *H01L 29/78636* (2013.01)

(58) Field of Classification Search
CPC ..................... H01L 27/1248; H01L 29/78636; H01L 21/0217; H01L 29/66742; H01L 21/02164; H01L 21/283; H01L 21/3205; H01L 21/32133; H01L 27/127
See application file for complete search history.

(56) References Cited

U.S. PATENT DOCUMENTS

2013/0248870 A1* 9/2013 Jung ..................... H01L 27/088 257/59
2014/0125907 A1* 5/2014 Nakazawa .......... G02F 1/13439 349/43

* cited by examiner

*Primary Examiner* — Long Pham
(74) *Attorney, Agent, or Firm* — Nath, Goldberg & Meyer; Joshua B. Goldberg; Christopher Thomas

(57) ABSTRACT

The invention discloses an array substrate, a manufacturing method thereof and a display device. The array substrate includes a gate, an active layer, a source and a drain on a substrate, and a pixel electrode located above the drain and lapped with the drain, and a part of the pixel electrode lapped with the drain is a lapping part of the pixel electrode; the array substrate further includes a first insulation layer located below the pixel electrode and in contact with the drain, the first insulation layer extends along the edge of the lapping part towards a direction away from the lapping part, part of the drain to be in contact with the lapping part is exposed from the first insulation layer, and the plane where the upper surface of the first insulation layer is located is lower than the plane where the upper surface of the drain is located.

10 Claims, 3 Drawing Sheets

ARRAY SUBSTRATE, MANUFACTURING METHOD THEREOF AND DISPLAY DEVICE

FIELD OF THE INVENTION

The present invention relates to the field of display technology, and particularly to an array substrate, a manufacturing method thereof and a display device.

BACKGROUND OF THE INVENTION

Liquid crystal display technology develops rapidly, and becomes a new star in the current industry and a hot spot in economic development. With the booming development of liquid crystal display, wide viewing angle, high image quality and fast response and the like become urgent requirements on a display device. A variety of the existing displays with different electric field modes have characteristics such as wide viewing angle, high image quality and fast response, therefore the display technologies are very suitable for the liquid crystal display field of a variety of dynamic images.

A pixel unit array is arranged on an array substrate of a liquid crystal display, and a thin film transistor functioning as a switch and a pixel electrode connected to the drain of the thin film transistor are provided in each pixel unit.

The drain of the thin film transistor is electrically connected to the pixel electrode to be supplied with a voltage. The pixel electrode covers the display area of a pixel unit, in order to ensure the light transmission of the pixel unit, the thickness of the pixel electrode is better to be thinner, and the thickness of the drain is typically much larger than that of the pixel electrode.

The manufacturing procedure of a traditional HADS type array substrate is as follows: sequentially forming a gate, a gate insulation layer, an active layer, a source, a drain, a pixel electrode, a passivation layer and a common electrode and the like on a substrate.

After the active layer, the source and the drain are formed, the pixel electrode is directly formed, the pixel electrode and the drain cause a large offset due to the fact that they are lapped with each other, and the pixel electrode is liable to break due to the fact that the pixel unit is thin, resulting in poor performance.

SUMMARY OF THE INVENTION

Embodiments of the present invention provide an array substrate, a manufacturing method thereof and a display device, which are used for solving the problem that a pixel electrode is liable to break when lapped with a drain.

The array substrate comprises a gate, a gate insulation layer, an active layer, a source and a drain, which are disposed on a substrate, and a pixel electrode located above the drain and lapped with the drain, and a part of the pixel electrode lapped with the drain is a lapping part of the pixel electrode, wherein the array substrate further includes:

a first insulation layer located below the pixel electrode and in contact with the drain, the first insulation layer extends along the edge of the lapping part towards a direction away from the lapping part, a part of the drain in contact with the lapping part is exposed from the first insulation layer, and the plane where the upper surface of the first insulation layer is located is lower than the plane where the upper surface of the drain is located.

Preferably, the first insulation layer is provided with an opening corresponding to a region other than the lapping part of the pixel electrode.

Preferably, the first insulation layer extends along the edge of the lapping part towards the direction away from the lapping part to cover the active layer exposed between the source and the drain.

Preferably, the source, the drain and the active layer are arranged in the same layer; and the thickness of the first insulation layer is smaller than that of the drain.

Preferably, the source and the drain are located above the active layer and form a laminated structure together with the active layer; and the thickness of the first insulation layer is smaller than the sum of the thicknesses of the drain and the active layer.

Preferably, the first insulation layer is a silicon nitride film layer or a silicon oxide film layer.

The embodiments of the present invention provide a manufacturing method of an array substrate, including:

a step of forming a gate, a gate insulation layer, an active layer, a source and a drain on a substrate, and a step of forming a first insulation layer and a pixel electrode, wherein the pixel electrode is lapped with the drain, and a part of the pixel electrode lapped with the drain is a lapping part of the pixel electrode;

wherein the step of forming the first insulation layer and the pixel electrode includes:

forming the first insulation layer and the pixel electrode on the substrate formed with the gate, the gate insulation layer, the active layer, the source and the drain, the first insulation layer is located between the pixel electrode and the gate insulation layer and extends along the edge of the lapping part towards the direction away from the lapping part, a part of the drain in contact with the lapping part is exposed from the first insulation layer, and the plane where the upper surface of the first insulation layer is located is lower than the plane where the upper surface of the drain is located; the pixel electrode is arranged on the drain and the first insulation layer, and is lapped with the exposed part of the drain.

Preferably, the step of forming the gate, the gate insulation layer, the active layer, the source and the drain on the substrate includes:

forming a pattern including the gate on the substrate;

forming the gate insulation layer on the substrate on which with the gate is formed; and forming a pattern including the active layer, the source and the drain on the substrate formed with the gate insulation layer.

Preferably, the step of forming the pattern including the active layer, the source and the drain on the substrate on which the gate insulation layer is formed comprises:

forming a semiconductor thin film on the substrate on which the gate insulation layer is formed; forming a conductive film layer on the semiconductor thin film; and patterning the conductive film layer and the semiconductor thin film through a single patterning process, in order to form a pattern of the mutually insulated source and the drain, and a pattern of the active layer located below the source and the drain; or forming a semiconductor thin film on the substrate on which the gate insulation layer is formed, and patterning the semiconductor thin film through a patterning process to form a pattern of the active layer; forming a conductive film layer on the substrate on which the pattern of the active layer is formed, and performing a patterning process on the conductive film layer so as to form a pattern of the source and the drain.

The embodiments of the present invention further provide a display device comprising the array substrate.

The array substrate provided by the embodiments of the present invention includes a gate, an active layer, a source and a drain, which are arranged on a substrate, and a pixel electrode located above the drain and lapped with the drain, and a part of the pixel electrode lapped with the drain is a lapping part of the pixel electrode; the array substrate further includes a first insulation layer located below the pixel electrode and in contact with the drain, the first insulation layer extends along the edge of the lapping part towards a direction away from the lapping part, a part of the drain in contact with the lapping part is exposed from the first insulation layer, and a first plane where the upper surface of the first insulation layer is located is lower than a second plane where the upper surface of the drain is located. Since the first plane where the upper surface of the first insulation layer is located is lower than the second plane where the upper surface of the drain is located, the pixel electrode is formed on the first insulation layer and the drain according to steps corresponding to the first plane and the second plane, and the two steps are used for reducing the local deformation degree of the pixel electrode and solving the problem that the pixel electrode is liable to break when lapped with the drain.

DETAILED DESCRIPTION OF THE EMBODIMENTS

Embodiments of the present invention provide an array substrate, a manufacturing method thereof and a display device, which are used for solving the problem that a pixel electrode is liable to break when lapped with a drain.

The embodiments of the present invention provide an array substrate, and similar to the array substrate in the prior art, the array substrate of the invention comprises a substrate, a gate, an active layer, a source and a drain disposed on the substrate, a gate insulation layer located between the gate and the active layer, and a pixel electrode lapped with the drain, wherein a part of the pixel electrode lapped with the drain is a lapping part of the pixel electrode; in order to solve the problem that a break is easy to occur in the pixel electrode due to the high step formed between the drain and the gate insulation layer when the pixel electrode is lapped with the drain, the array substrate further comprises a first insulation layer located between the pixel electrode and the gate insulation layer and extending along the edge of the lapping part towards a direction away from the lapping part, a part of the drain in contact with the lapping part is exposed from the first insulation layer, and the plane where the upper surface of the first insulation layer is located is lower than the plane where the upper surface of the drain is located. The pixel electrode is formed on the drain, the first insulation layer and the gate insulation layer, such that the local deformation of the pixel electrode and also the probability of breakage when the pixel electrode is lapped with the drain are reduced.

Technical solutions provided by the embodiments of the present invention will be described below in detail in conjunction with accompanying drawings.

Figure 1:
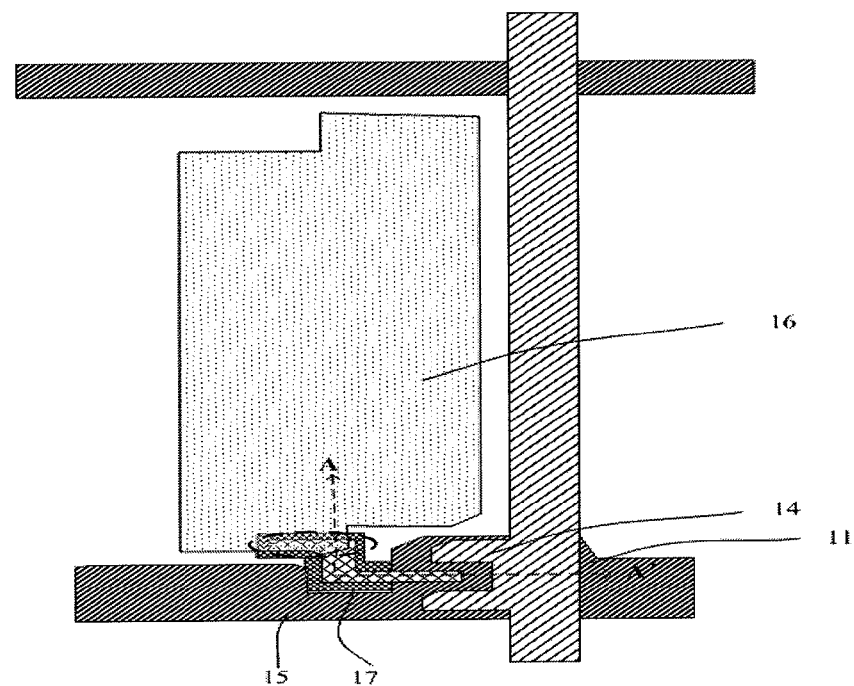
FIG. 1 is a schematic top view of an array substrate provided by an embodiment of the present invention.
Figure 2:
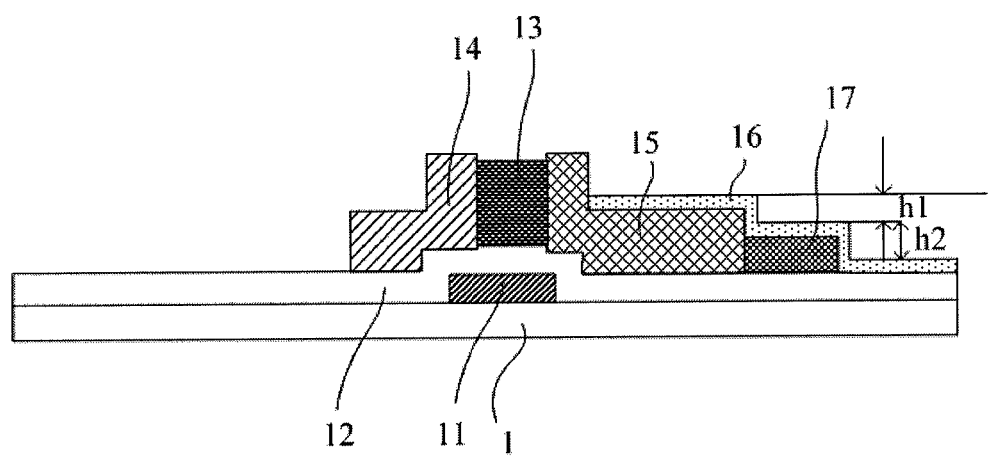
FIG. 2 is a schematic sectional view of the array substrate along an A'-A direction as shown in FIG. 1 according to embodiment 1.
Figure 3:
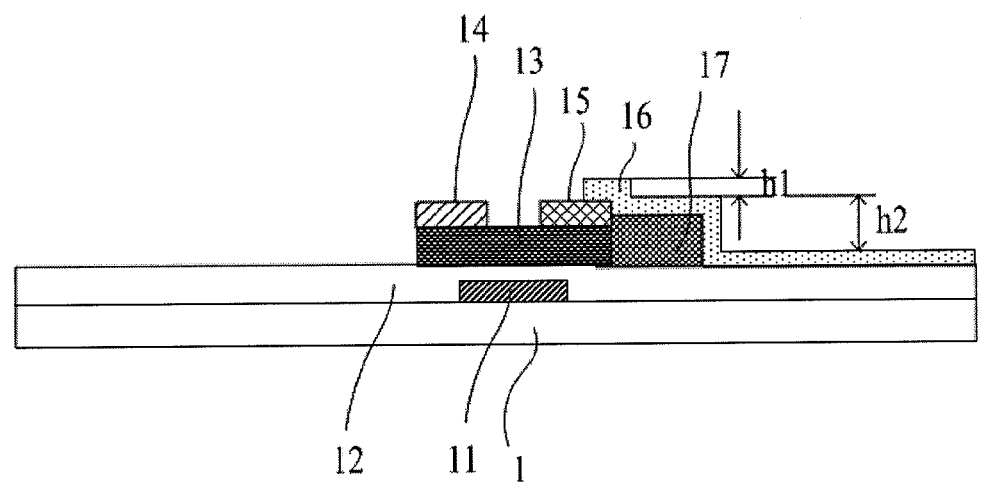
FIG. 3 is a schematic sectional view of the array substrate along an A'-A direction as shown in FIG. 1 according to embodiment 2.

FIG. 1 is a schematic top view of an array substrate provided by an embodiment of the present invention; FIG. 2 is a schematic sectional view of the array substrate along an A'-A direction as shown in FIG. 1 according to embodiment 1; and FIG. 3 is a schematic sectional view of the array substrate along an A'-A direction as shown in FIG. 1 according to embodiment 2.

The array substrate comprises:

a gate 11, an active layer 13, a source 14 and a drain 15, which are disposed on a substrate 1, a gate insulation layer 12 located between the gate 11 and the active layer 13, and a pixel electrode 16 located above the drain 15 and lapped with the drain 15, wherein a part of the pixel electrode 16 lapped with the drain 15 is a lapping part (can also be called a connection part) of the pixel electrode 16; and the gate 11, the gate insulation layer 12, the active layer 13, the source 14 and the drain 15 form a thin film transistor (TFT), and the structure of the TFT is similar to the structure of a TFT in the prior art.

The array substrate further includes:

a first insulation layer 17 located between the pixel electrode 16 and the gate insulation layer 12 and extending along the edge of the lapping part (the region enclosed by dotted lines in FIG. 1) towards a direction away from the lapping part, a part of the drain in contact with (namely, connected to) the lapping part is exposed from the first insulation layer 17, and the plane where the upper surface of the first insulation layer 17 is located is lower than the plane where the upper surface of the drain 15 is located.

In the array substrate as shown in FIG. 1, the source 14, the drain 15 and the active layer 13 are arranged in at least two following manners:

The first embodiment as shown in FIG. 1: the source, the drain and the active layer are arranged in the same layer, and the thickness of the first insulation layer is smaller than that of the drain.

The second embodiment as shown in FIG. 2: the source and the drain are located above the active layer, and form a laminated structure together with the active layer; the thickness of the first insulation layer is smaller than the sum of the thicknesses of the drain and the active layer.

See FIG. 2, the source 14, the drain 15 and the active layer 13 are arranged in the same layer, and the lower surfaces of the first insulation layer 17 and the drain 15 are located on the same plane, since the plane where the upper surface of the first insulation layer 17 is located is lower than the plane where the upper surface of the drain 15 is located, the thickness of the first insulation layer 17 is smaller than that of the drain 15.

See FIG. 2, since the thickness of the first insulation layer 17 is smaller than that of the drain 15, and the lower surfaces of the first insulation layer 17 and the drain 15 are located on the same plane (located on the gate insulation layer 12), the surface of the first insulation layer 17 in contact with the pixel electrode 16 is a first step, and the surface of the drain 15 in contact with the pixel electrode 16 is a second step; the distance between the first step and the second step is h1, and the distance between the first step and the gate insulation layer 12 is h2. Since the thicknesses throughout the pixel electrode 16 are equal, thus the formed pixel electrode 16 has parts matched with the first step and the second step, and a part in contact with the gate insulation layer 12. The height difference of the part on the first step and the part in contact with the gate insulation layer 12 of the pixel electrode 16 is h2, and the height difference of the part on the first step and the part on the second step of the pixel electrode 16 is h1, and the first insulation layer 17 is used for reducing the local deformation of the pixel electrode 16 and solving the problem that the pixel electrode 16 is liable to break when lapped with the drain 15.

In the embodiment, the thickness of the drain 15 is preferably in a range of 3500-5000 Å and is more preferably about 4000 Å, the thickness of the first insulation layer 17 is in a range of 1000-3000 Å and is more preferably about 1500 Å, and the thickness of the first insulation layer 17 is smaller than that of the drain 15, in order to avoid breakage of the pixel electrode 16.

See FIG. 3, the source 14 and the drain 15 are located above the active layer 13 and form a laminated structure together with the active layer 13.

The drain 15 and the active layer 13 are laminated, the lower surfaces of the active layer 13 and the first insulation layer 17 are located on the same plane, and since the plane where the upper surface of the first insulation layer 17 is located is lower than the plane where the upper surface of the drain 15 is located, the thickness of the first insulation layer 17 is smaller than the sum of the thickness of the drain 15 and the thickness of the active layer 13.

See FIG. 3, since the thickness of the first insulation layer 17 is smaller than the sum of the thickness of the drain 15 and the thickness of the active layer 13, and the lower surfaces of the first insulation layer 17 and the active layer 13 are located on the same plane (located on the gate insulation layer 12), the surface of the first insulation layer 17 in contact with the pixel electrode 16 is the first step, and the surface of the drain 15 in contact with the pixel electrode 16 is the second step; see FIG. 3, since the thickness of the first insulation layer 17 is smaller than the sum of the thickness of the drain 15 and the thickness of the active layer 13, and the lower surfaces of the first insulation layer 17 and the active layer 13 are located on the same plane (located on the gate insulation layer 12), the distance between the first step and the second step is h1, and the distance between the first step and the gate insulation layer 12 is h2. Since the thicknesses throughout the pixel electrode 16 are equal, thus the formed pixel electrode 16 has parts matched with the first step and the second step, and a part in contact with the gate insulation layer. The height difference of the part on the first step and the part in contact with the gate insulation layer 12 of the pixel electrode 16 is h2, and the height difference of the part on the first step and the part on the second step of the pixel electrode 16 is h1, and the first insulation layer is used for reducing the local deformation of the pixel electrode 16 and solving the problem that the pixel electrode 16 is liable to break when lapped with the drain 15.

Figure 4:
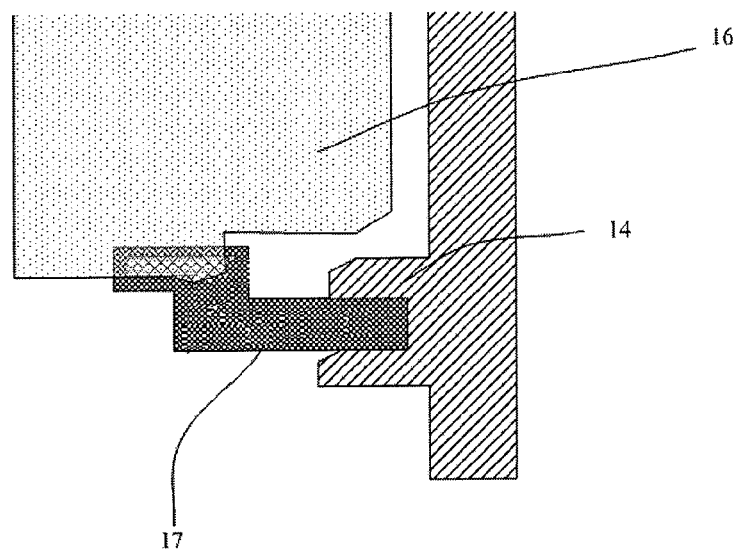
FIG. 4 is an amplified partial view of the array substrate as shown in FIG. 1.

FIG. 4 is an amplified partial view of the array substrate as shown in FIG. 1. As shown in FIG. 4, the first insulation layer extends along the edge of the lapping part towards the direction away from the lapping part, the formed first insulation layer is provided with at least one opening, the outline of the opening is overlapped with the lapping part, and the opening exposes the part of the drain at the corresponding region of the lapping part.

The opening in the first insulation layer can also extend to the entire drain, even if the opening exposes the entire drain, it should be ensured that the first insulation layer is in contact with the edge of the drain and is particularly in contact with the edge of the drain covered by the pixel electrode.

Preferably, the first insulation layer is a silicon nitride film layer or a silicon oxide film layer, or a laminated structure of the silicon nitride film layer and the silicon oxide film layer.

The first insulation layer is formed for example by film coating, one exemplary condition is as follows: the first insulation layer is covered on the entire surface of the substrate, and the first insulation layer on the substrate is continuous except the opening in the first insulation layer corresponding to the lapping part of the pixel electrode; in other examples, the first insulation layer can also be provided with necessary patterns or openings at other regions as desired.

That is to say, the lower side of the entire pixel electrode is covered with the first insulation layer, in order to improve the light transmission of the pixel unit, preferably, an opening exposing a part other than the lapping part of the pixel electrode is further arranged on the first insulation layer.

Figure 5:
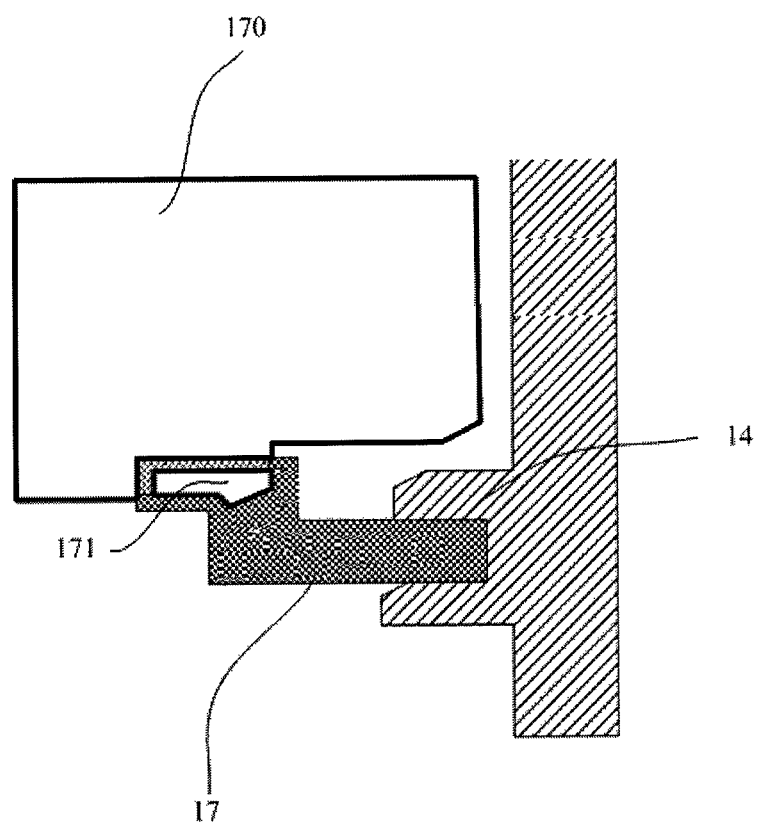
FIG. 5 is a schematic top view of a first insulation layer of the array substrate as shown in FIG. 1.

FIG. 5 is a schematic top view of the first insulation layer 17 corresponding to the array substrate as shown in FIG. 4. As shown in FIG. 5, a first opening 170 is arranged in the first insulation layer 17, and the first opening 170 is corresponding to a region other than the lapping part of the pixel electrode 16 as shown in FIG. 4; when the pixel electrode 16 as shown in FIG. 4 is located on the first insulation layer 17, the region directly under the pixel electrode 16 is not blocked by the first insulation layer, preventing the first insulation layer 17 from reducing the light transmission of the corresponding area of the pixel electrode 16. A second opening 171 corresponding to the lapping part is further exposed from the first insulation layer 17.

It should be noted that, the shape of the pixel electrode, the shapes of the source, the drain and the active layer and the shapes of the first opening and the second opening are not limited in the present invention. The graphs in the accompanying drawings are merely used for exemplarily illustrating the above-mentioned embodiments of the present invention, rather than limiting the present invention.

In the array substrate provided by the above-mentioned embodiments, the active layer is arranged in two following manners: the source, the drain and the active layer are located in the same layer, and the source and the drain are located above the active layer to form a laminated structure.

For example, the active layer is located below the source and the drain, a part of the active layer is exposed between the source and the drain to serve as a channel when the TFT is turned on, and the projections of the source and the drain in the vertical direction are within in the projection of the active layer in the vertical direction. When the pixel electrode is arranged above the active layer, the active layer will be influenced in the etching process performed on the pixel electrode, for example, an etching gas used for etching the pixel electrode will influence the electrical properties of the active layer to cause a degraded TFT. In order to solve the above-mentioned problem, preferably, it is ensured that the first insulation layer extending along the edge of the lapping part towards the direction away from the lapping part completely covers the area of the active layer exposed between the source and the drain. That is to say, the first insulation layer is further arranged on the part of the active layer exposed between the source and the drain.

In a specific implementation, the source, the drain and the active layer can be formed in the same layer.

It should be noted that, in the description, the projection in the vertical direction refers to the projection in the direction vertical to the plane of the film layer, and when the thin film transistor is formed on the substrate, the plane is parallel to the plane of the substrate, at this time, the vertical direction is the direction vertical to the plane of the substrate.

The manufacturing method of the array substrate provided by the above-mentioned embodiments of the present invention will be described below in detail.

The manufacturing method of the array substrate provided by the embodiments of the present invention comprises:

a step of forming a gate, a gate insulation layer, an active layer, a source and a drain on a substrate, and a step of forming a first insulation layer and a pixel electrode, wherein the pixel electrode is lapped with the drain, and a part of the pixel electrode lapped with the drain is a lapping part of the pixel electrode;

wherein the step of forming the first insulation layer and the pixel electrode includes:

forming the first insulation layer and the pixel electrode on the substrate formed with the gate, the gate insulation layer, the active layer, the source and the drain, the first insulation layer is located between the pixel electrode and the gate insulation layer and extends along the edge of the lapping part towards the direction away from the lapping part, a part of the drain in contact with the lapping part is exposed from the first insulation layer, and the plane where the upper surface of the first insulation layer is located is lower than the plane where the upper surface of the drain is located; the pixel electrode is located on the drain and the first insulation layer and is lapped with the exposed part of the drain.

Preferably, the step of forming the gate, the gate insulation layer, the active layer, the source and the drain on the substrate includes:

forming a pattern including the gate on the substrate;

forming the gate insulation layer on the substrate on which the gate is formed; and forming a pattern including the active layer, the source and the drain on the substrate formed with the gate insulation layer.

Further, the step of forming the pattern including the active layer, the source and the drain on the substrate on which the gate insulation layer is formed includes:

forming a semiconductor thin film on the substrate on which the gate insulation layer is formed; forming a conductive film layer on the semiconductor thin film; and patterning the conductive film layer and the semiconductor thin film through a single patterning process, in order to form a pattern of the mutually insulated source and the drain, and a pattern of the active layer located below the source and the drain; or forming a semiconductor thin film on the substrate on which the gate insulation layer is formed, and patterning the semiconductor thin film through a patterning process to form a pattern of the active layer; forming a conductive film layer on the substrate on which the pattern of the active layer is formed, and performing a patterning process on the conductive film layer to form a pattern of the source and the drain.

The gate, the gate insulation layer, the active layer, the source and the drain form a thin film transistor (TFT), and the TFT can be a bottom gate type TFT or a top gate type TFT;

For the bottom gate type TFT, the manufacturing method of the array substrate specifically comprises the following steps:

step 1: forming a pattern including the gate on the substrate;

step 2: forming the gate insulation layer on the substrate on which the gate is formed;

step 3: forming a pattern including the active layer, the source and the drain on the substrate formed with the gate insulation layer, which will be described thereinafter;

step 4: forming the first insulation layer exposing the part of the drain at the region corresponding to the lapping part on the substrate on which the active layer, the source and the drain are formed;

step 5: forming the pixel electrode on the substrate on which the first insulation layer is formed.

The step of forming the pattern including the active layer, the source and the drain on the substrate formed with the gate insulation layer comprises:

forming a semiconductor layer on the substrate, on which the gate insulation layer is formed, to cover the entire substrate; forming a conductive film layer on the semiconductor layer to cover the entire substrate; and etching the conductive film layer and the semiconductor layer through a single masking process, respectively to form the pattern of the mutually insulated source and the drain, and the pattern of the active layer located below the source and the drain; or forming a semiconductor layer on the substrate, on which the gate insulation layer is formed, to cover the entire substrate, and etching the semiconductor layer to form the pattern of the active layer using a mask; forming a conductive film layer on the substrate formed with the pattern of the active layer to cover the entire substrate, and etching the conductive film layer using a mask to form the pattern of the source and the drain.

As for the top gate type TFT, the manufacturing method of the array substrate specifically comprises the following steps:

step 1: forming the source, the drain and the active layer on the substrate; wherein the source, the drain and the active layer can be formed on the substrate in the following two manners:

In the first manner: forming a semiconductor layer on the substrate to cover the entire substrate; forming a conductive film layer on the semiconductor layer to cover the entire substrate; etching the conductive film layer and the semiconductor layer through a single masking process, respectively to form the pattern of the mutually insulated source and the drain, and the pattern of the active layer located below the source and the drain;

In the second manner: forming a semiconductor layer on the substrate, etching the semiconductor layer using a mask to form the pattern of the active layer; forming a conductive film layer on the substrate, on which the pattern of the active layer is formed, to cover the entire substrate, and etching the conductive film layer using a mask to form the pattern of the source and the drain;

step 2: forming the first insulation layer surrounding the drain;

step 3: forming the pixel electrode on the first insulation layer and the drain;

step 4: forming the gate insulation layer on the pixel electrode, and forming the gate on the gate insulation layer.

If the source, the drain and the active layer are formed on the substrate in the first manner, the formed source and drain are located below the active layer, which can be specifically achieved by the following steps: forming the semiconductor layer through a single film coating process to cover the entire substrate, and forming a conductive layer through a single film coating process to cover the entire substrate; blocking the areas of the source and the drain to be formed by using a mask plate to expose other areas, etching the conductive layer to form the source and the drain, and then etching the semiconductor layer to reserve the parts of the semiconductor layer below the source and the drain and between the source and the drain, and removing the remaining parts of the semiconductor layer, wherein the reserved parts of the semiconductor layer form the pattern of the active layer.

If the source, the drain and the active layer are formed on the substrate in the second manner, the formed source, drain and active layer are located inn the same layer, and this can be specifically achieved by the following steps: forming the active layer through a single film coating process and a single patterning process, and forming the source and the drain on the formed active layer through a single film coating process and a single patterning process.

The embodiments of the present invention further provide a display device, including the array substrate provided by the embodiments of the present invention, wherein the display device can be a liquid crystal display device such as a liquid crystal display television or a liquid crystal display screen or the like, or an organic light emitting display device such as a flexible display device, flexible electronic paper.

Apparently, those skilled in the art can make various variations and modifications to the present invention, without departing from the spirit and scope of the present invention. In this case, if these variations and modifications of the present invention fall within the scope of the claims of the present invention and the equivalent technology thereof, the present invention is intended to encompass these variations and modifications.

The invention claimed is:

1. An array substrate, comprising: a gate, a gate insulation layer, an active layer, a source and a drain, which are disposed on a substrate; and a pixel electrode located above the drain and lapped with the drain, and a part of the pixel electrode lapped with the drain is a lapping part of the pixel electrode, wherein the array substrate further comprises:
   a first insulation layer located below the pixel electrode and in contact with the drain, wherein the first insulation layer extends along the edge of the lapping part towards a direction away from the lapping part, a part of the drain in contact with the lapping part is exposed from the first insulation layer, and the plane where the upper surface of the first insulation layer is located is lower than the plane where the upper surface of the drain is located.

2. The array substrate of claim 1, wherein the first insulation layer is provided with an opening corresponding to a region other than the lapping part of the pixel electrode.

3. The array substrate of claim 1, wherein the first insulation layer extends along the edge of the lapping part towards the direction away from the lapping part to cover the active layer exposed between the source and the drain.

4. The array substrate of claim 1, wherein the source, the drain and the active layer are arranged in the same layer; and the thickness of the first insulation layer is smaller than that of the drain.

5. The array substrate of claim 1, wherein the source and the drain are located above the active layer, and form a laminated structure together with the active layer; and
   the thickness of the first insulation layer is smaller than the sum of the thicknesses of the drain and the active layer.

6. The array substrate of claim 1, wherein the first insulation layer is a silicon nitride film layer or a silicon oxide film layer.

7. A manufacturing method of an array substrate of claim 1, comprising:
   a step of forming a gate, a gate insulation layer, an active layer, a source and a drain on a substrate, and a step of forming a first insulation layer and a pixel electrode, wherein the pixel electrode is lapped with the drain, and a part of the pixel electrode lapped with the drain is a lapping part of the pixel electrode;
   wherein the step of forming the first insulation layer and the pixel electrode comprises:
   forming the first insulation layer and the pixel electrode on the substrate formed with the gate, the gate insulation layer, the active layer, the source and the drain, wherein the first insulation layer is located between the pixel electrode and the gate insulation layer and extends along the edge of the lapping part towards the direction away from the lapping part, a part of the drain in contact with the lapping part is exposed from the first insulation layer, and the plane where the upper surface of the first insulation layer is located is lower than the plane where the upper surface of the drain is located; the pixel electrode is arranged on the drain and the first insulation layer and is lapped with the exposed part of the drain.

8. The manufacturing method of an array substrate of claim 7, wherein the step of forming the gate, the gate insulation layer, the active layer, the source and the drain on the substrate comprises:
   forming a pattern including the gate on the substrate;
   forming the gate insulation layer on the substrate on which the gate is formed; and
   forming a pattern including the active layer, the source and the drain on the substrate formed with the gate insulation layer.

9. The manufacturing method of an array substrate of claim 8, wherein the step of forming a pattern including the active layer, the source and the drain on the substrate on which the gate insulation layer is formed comprises:
   forming a semiconductor thin film on the substrate on which the gate insulation layer is formed; forming a conductive film layer on the semiconductor thin film; and patterning the conductive film layer and the semiconductor thin film through a single patterning process, in order to form a pattern of the mutually insulated source and the drain, and a pattern of the active layer located below the source and the drain; or
   forming a semiconductor thin film on the substrate on which the gate insulation layer is formed, and patterning the semiconductor thin film through a patterning process to form a pattern of the active layer; forming a conductive film layer on the substrate on which the pattern of the active layer is formed, and performing a patterning process on the conductive film layer so as to form a pattern of the source and the drain.

10. A display device, comprising the array substrate of claim 1.

* * * * *